United States Patent [19]

Thomson et al.

[11] Patent Number: 5,076,427
[45] Date of Patent: Dec. 31, 1991

[54] TAPE FOR STORAGE OF ELECTRONIC COMPONENTS

[75] Inventors: John H. Thomson, St. Andrews; Alan Reddie, Fife, both of Scotland

[73] Assignee: Reel Service Limited, Fife, Scotland

[21] Appl. No.: 678,961

[22] PCT Filed: Oct. 27, 1989

[86] PCT No.: PCT/GB89/01283

§ 371 Date: Jun. 10, 1991

§ 102(e) Date: Jun. 10, 1991

[87] PCT Pub. No.: WO90/04915

PCT Pub. Date: May 3, 1990

[30] Foreign Application Priority Data

Oct. 27, 1988 [GB] United Kingdom ............... 8825154

[51] Int. Cl.[5] ............................................. B65D 73/02
[52] U.S. Cl. .................................... 206/330; 206/332
[58] Field of Search ............... 206/328, 329, 330, 332, 206/460, 486, 331

[56] References Cited

U.S. PATENT DOCUMENTS

| 4,564,880 | 1/1986 | Christ et al. ............... 206/334 X |
| 4,615,441 | 10/1986 | Nakamura ..................... 206/329 |
| 4,633,370 | 12/1986 | Hamuro et al. ............... 206/330 X |
| 4,702,370 | 10/1987 | Honda ............................ 206/331 |
| 4,712,675 | 12/1987 | Scholten et al. ................ 206/332 |
| 4,781,953 | 11/1988 | Ball ........................... 206/332 X |
| 4,852,737 | 8/1989 | Noll ........................... 206/329 X |
| 4,898,275 | 2/1990 | Skrtic et al. ................ 206/332 X |
| 4,944,797 | 7/1990 | Gagliano et al. ............. 206/330 X |
| 4,966,281 | 10/1990 | Kawanishi et al. .............. 206/330 |

FOREIGN PATENT DOCUMENTS 2163401 2/1986 United Kingdom .

Primary Examiner—Paul T. Sewell
Assistant Examiner—Jacob K. Ackun, Jr.
Attorney, Agent, or Firm—Bell, Seltzer, Park & Gibson

[57] ABSTRACT

A tape (10) for storage of electronic flatpacks (18) has pockets (12) each of which has a floor (12A) inwardly deformed to define a protrusion (14) which is square in outline. The protrusion (14) defines a support surface (14A) disposed at a first clearance (X) from the pocket floor (12A) and a ridge (14B) which extends along the outer peripheral boundary of the support surface (14A), the top of the ridge (14B) being disposed at a second clearance (Y) from the pocket floor (12A) and by a third clearance (Z) from the walls (16) of the pocket (12). An electronic flatpack (18) having a body (19) and protruding cranked connector pins (20) is carried by the support surface (14A), the pins (20) being disposed over the ridge (14B) and in the third clearance (Z). When the flatpack (18) is lifted from the pocket (12), clearances (X) and (Z) prevent the pins (20) from being damaged by coming into contact with the walls (16) or floor of the pocket. A cover film (21) is releasably secured along the length of the tape (10) to hold the flatpacks (18) into the support surface (14A) and to permit the tape (10) to be wound on a storage reel (24A).

6 Claims, 1 Drawing Sheet

TAPE FOR STORAGE OF ELECTRONIC COMPONENTS

The present invention relates to a tape having a series of recesses along its length for storage of electronic components.

An electronic flatpack is a relatively thin package containing numerous electronic components and which is rectilinear in shape (being either square or rectangular) provided on all four side faces with protruding, cranked or gull wing, connector pins, which are generally made of fine closely spaced wires for connection of the components to a printed circuit. The connector pins are numerous to convey signals to and from the numerous components contained within the flatpack and as the packing density of these components increases so the gauge of the pins and the spacing of the pins decreases so that in flatpacks which are currently available the pins are filigree in nature and highly vulnerable to damage or distortion prior to being secured to the printed circuit.

Conventionally, before assembly on a printed circuit these flatpacks are stored in trays of about thirty in respective recesses and the trays are stacked one on top of another. This does not provide for adequate security or protection against damage to the connector pins since the trays may be upset leading to a spillage of flatpacks. The flatpacks are relatively free to move within their respective recesses which leads to damaged pins during movement of the trays and the trays are open at the top leading to contamination of the flatpacks by dust and dirt.

Removal of the flatpack from the tray recess is often an automatic process in which a pick-up device such as a suction nozzle is placed in contact with and lifts the flatpack. Often, however, the lift is not vertical and the protruding cranked connector pins are deformed or broken off due to contact with the walls or floor of the recess making the flatpack difficult or impossible to fit to the printed circuit, or inoperative.

It is an object of the present invention to obviate or substantially mitigate the aforementioned problems.

According to one aspect of the present invention there is provided a tape for storage of electronic components, said tape comprising a series of recesses along its length which have been depressed out of the original plane of the tape and whose openings lie in the original plane of the tape, each recess comprising a floor and walls, the floor being disposed at a predetermined depth from the original plane of the tape, the series of recesses being spaced inwardly from the edges of the tape to define outer marginal edge portions on the tape characterised in that along each tape marginal edge portion is provided a row of sprocket holes and, inwardly of said holes, a continuous tape surface for reception of a line of adhesive releasably to secure a length of cover film over the series of recesses, and in that a portion of the floor of each recess is deformed to define within the recess an upstand extending in a generally rectilinear fashion around the floor, the upstand being profiled in cross-section to define a generally rectilinear support surface disposed at a first clearance from said floor and a ridge at the peripherally outer boundary of the support surface, the top of the ridge being disposed at a second clearance from said floor, the second clearance being greater than the first clearance, and the ridge being spaced by a third clearance from the adjacent wall of said recess, the arrangement being such that in use each recess is adapted to store an electronic flatpack having protruding connector pins, the body of the flatpack being carried by the support surface and held against the support surface by the cover film, and being restricted in lateral movements by the ridge, with the cranked connector pins being disposed over said ridge and extending into said third clearance.

Preferably said recess is square in outline and the upstand has four separated portions respectively aligned with the adjacent wall of said recess.

Preferably also said tape is made of a semi-rigid material so that the tape portions separating adjacent recesses are capable of providing a hinge function whereby the tape can be wound on a storage reel without distortion of the individual recesses.

According to a further aspect of the present invention there is provided the combination of a tape as defined in the third preceding paragraph, an electronic flatpack stored in each recess of the tape, a cover film releasably secured along the length of the tape, by only two lines of adhesive extending along said continuous tape surfaces so that the film covers the opening of each recess and abuts the body of the flatpack therein, and a reel on which the tape is wound.

Preferably the tape is provided with about 250 recesses along its length.

By virtue of the present invention an electronic flatpack having protruding cranked connector pins is stored in a recess disposed on a tape and is carried by a support surface formed by inward deformation of a portion of said recess floor, said support surface facilitating removal of said flatpack using a suction nozzle with minimal contact between said connector pins and the walls of said recess.

An embodiment of the present invention will now be described with reference to the accompanying drawings in which.

Figure 1:
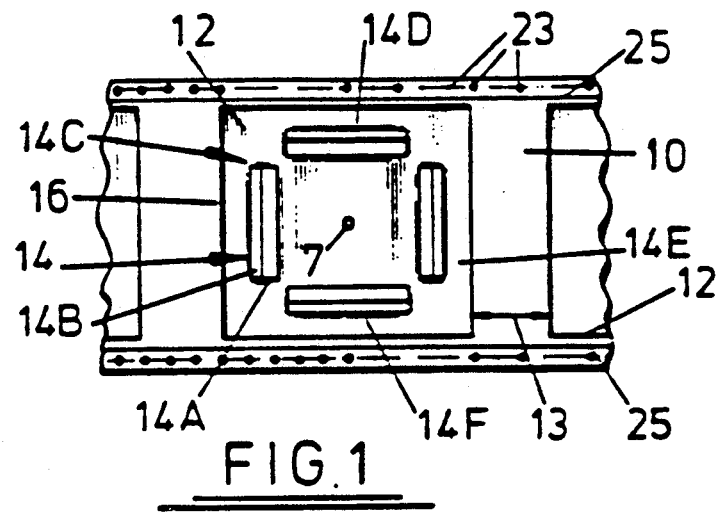
FIG. 1 shows a plan view of part of a tape in accordance with the present invention.
Figure 3:
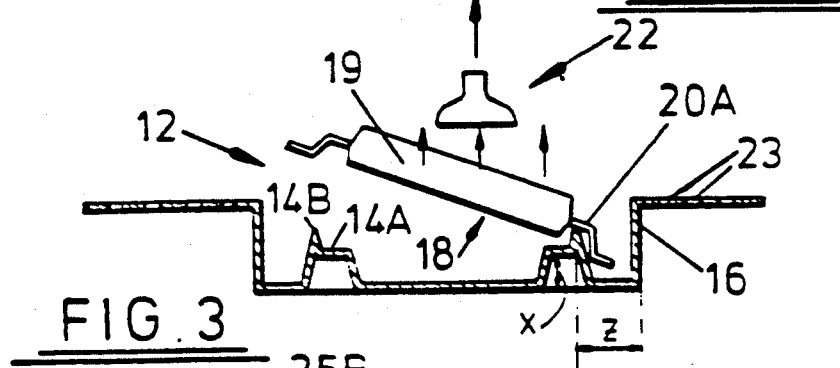
Figure 4:
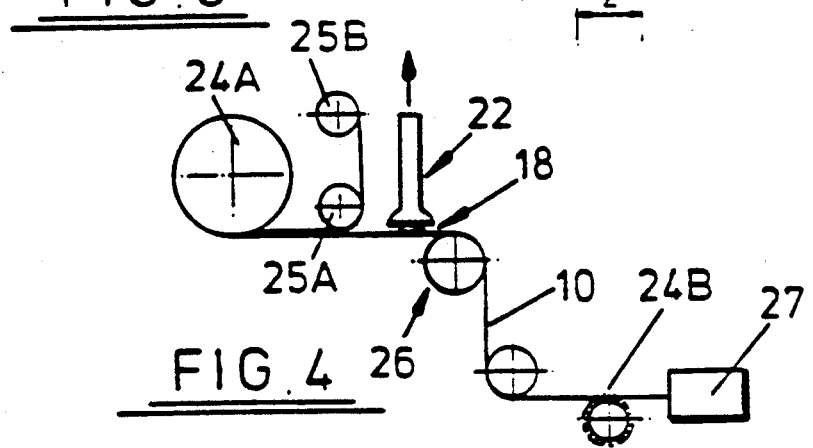

FIGS. 3 and 4 schematically illustrate removal of a flatpack from the FIG. 1 tape.

With reference to FIG. 1 a tape 10 in accordance with the present invention comprises a series of recesses 12 along its length, only one of which is shown in the interests of clarity. The tape is made of semi-rigid plastics material and the recesses, which are square in outline, are separated from one another along the length of the tape by tape portions 13 which are bendable so as to function as hinge like portions. The recesses 12 by virtue of being pressed or moulded out of the original plane 8 of the tape are relatively rigid. Each recess 12 has walls 16 and a recess floor 12A, at a depth W from the original plane 8 of the tape, (shown in FIG. 2), which is inwardly deformed to define an upstand 14 around the recess floor 12A with portions in alignment with the recess walls 16. The upstand 14 is itself profiled to define a support surface 14A (which also extends generally rectilinearly) disposed at a first clearance X from the recess floor 12A and a ridge 14B which extends along the outer peripheral boundary of the support surface 14A, being offset from the longitudinal centre line of the support surface 14A towards the recess walls 16. The top of the ridge 14B is disposed at a second clearance Y from the recess floor 12A and is spaced by a third clearance Z from the walls 16 of the recess.

The upstand 14 shown in FIG. 1 is formed by four separated portions 14C, 14D, 14E, 14F which are respectively aligned with the walls 16 of the recess 12. It will, however be appreciated that the upstand 14 could be unitary and extend in a generally rectilinear fashion around the recess floor. Also, the recess and the upstand may both be either square or rectangular in outline according to the outline shape of the flatpack 18 which is to be housed. Currently known flatpacks are either square or rectangular in outline.

Figure 2:
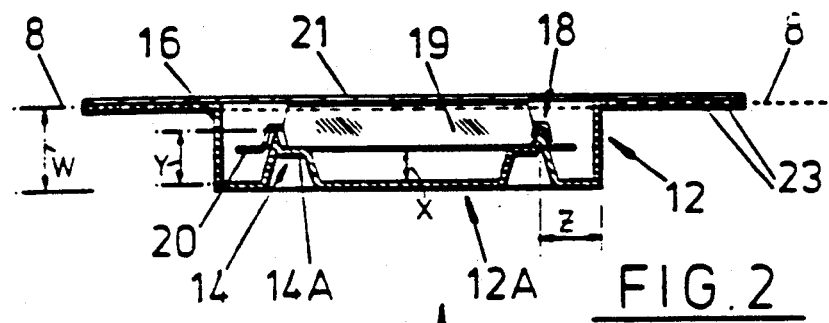
FIG. 2 shows a sectional view of the tape taken on the line A—A of FIG. 1 and with a flatpack.

As can be seen in FIG. 2 the flatpack 18 has a relatively thin body 19 from which protrude cranked connector pins 20 which are very fragile. The body 19 is of predetermined dimensions and is carried in the recess 12 by the support surface 14A with the pins 20 disposed over the ridge 14B and projecting into the third clearance Z. The thickness of the body 19 governs the dimension W-X so that the upper surface of the body 19 is essentially aligned with the original plane 8 of the tape 10 and a cover film 21 is releasably secured over the opening into the recess 12 to hold the flatpack 18 onto the support surface 14A. Film 21 extends along the length of the tape 10 and is secured thereto by only two longitudinally extending lines of adhesive 25 (FIG. 1) which respectively lie between a tape edge and a recess edge. This arrangement facilitates peel back of the film when the tape is in use as will be explained. Also, along each tape edge, and laterally outside the cover film 21 are rows of sprocket holes 23 which permit the tape 10 to be controllably unwound from its storage reel 24A (shown in FIG. 4).

During assembly of a printed circuit which requires a number of flatpacks 18 the tape is unwound from the reel 24A by a pull-off sprocket 24B which is controllably indexed to present a flatpack 18 at a withdrawal station 26. The cover film 21 is peeled back around rollers 25A and 25B to expose the flatpack at station 26 whereat a suction nozzle 22 is moved to engage and lift the flatpack 18 from the recess 12 as schematically shown in FIG. 4. There is a small inspection hole 7 in base of the tape to line up suction nozzle 22 at the station 26. If, as shown in FIG. 3, the lift is not orthogonal to the floor 12A of the recess 12 and the flatpack 18 is removed at an angle, because the support surface 14A is disposed from the recess floor by a clearance X and the ridge 14B is disposed at a clearance Z from the recess wall 16 and by clearance Y from floor 12A the pins 20A are prevented from coming into contact with the wall 16 or the floor 12A so that damage to the pins 20A is prevented. Following removal of the flatpack 18 from the recess 12 the tape is indexed forward by sprocket wheel 24B and is engaged by a chopping device 27 which chops the used tape into short lengths for subsequent disposal.

The support surface 14A surrounds a hollow to provide strength to the upstands 14C, 14D, 14E, 14F. The tape is fabricated of a semi-rigid plastics material such as polystyrene or PVC to facilitate winding of the tape onto the reel 24A. Additionally the film covering the pockets on the tape may be transparent to allow inspection of the flatpacks therein.

We claim:

1. A tape (10) for storage of electronic components, said tape comprising a series of recesses (12) along its length which have been depressed out of the original plane of the tape and whose openings lie in the original plane of the tape (10), each recess (12) comprising a floor (12A) and walls, the floor (12A) being disposed at a predetermined depth (W) from the original plane (8) of the tape, the series of recesses (12) being spaced inwardly from the edges of the tape to define outer marginal edge portions on the tape characterised in that along each tape marginal edge portion is provided a row of sprocket holes (23) and, inwardly of said holes (23), a continuous tape surface for reception of a line of adhesive releasably to secure a length of cover film (21) over the series of recesses (12), and in that a portion of the floor (12A) of each recess (12) is deformed to define within the recess (12) an upstand (14) extending in a generally rectilinear fashion around the floor (12A), the upstand (14) being profiled in cross-section to define a generally rectilinear support surface (14A) disposed at a first clearance (X) from said floor and a ridge (14B) at the peripherally outer boundary of the support surface (14A), the top of the ridge (14B) being disposed at a second clearance (Y) from said floor, the second clearance (Y) being greater than the first clearance (X), and the ridge (14B) being spaced by a third clearance (Z) from the adjacent wall (16) of said recess (12), the arrangement being such that in use each recess (12) is adapted to store an electronic flatpack (18) having protruding connector pins (20), the body (19) of the flatpack being carried by the support surface (14A) and held against the support surface (14A) by the cover film (21), and being restricted in lateral movements by the ridge (14B), with the cranked connector pins (20) being disposed over said ridge (14B) and extending into said third clearance (Z).

2. A tape as claimed in claim 1, characterised in that the upstand (14) surrounds a portion of the floor (12A) containing a small inspection hole (7).

3. A tape as claimed in either preceding claim, characterised in that said recess (12) is square in outline and the upstand (14) has four separated portions (14C), (14D), (14E), (14F) respectively aligned with the adjacent wall (16) of the recess.

4. A tape as claimed in claim 1, characterised in that the tape (10) is made of a semi-rigid plastics material so that the tape portions (13) separating adjacent recesses (12) are capable of providing a hinge function whereby the tape (10) can be wound on a storage reel without distortions of the individual recesses (12).

5. The combination of a tape as claimed in claim 1, an electronic flatpack (18) stored in each recess (12) of the tape (10), a cover film (21) releasably secured along the length of the tape (10), by only two lines (25) of adhesive extending along said continuous tape surfaces so that the film (21) covers the opening of each recess (12) and abuts the body of the flatpack (18) therein, and a reel (24A) on which the tape (10) is wound.

6. The combination as claimed in claim 5, characterised in that the cover film (21) is transparent to permit inspection of enclosed flatpacks (18).

* * * * *